United States Patent [19]

Chatterjee

[11] Patent Number: 4,740,826
[45] Date of Patent: Apr. 26, 1988

[54] VERTICAL INVERTER

[75] Inventor: Pallab K. Chatterjee, Dallas, Tex.

[73] Assignee: Texas Instruments Incorporated, Dallas, Tex.

[21] Appl. No.: 780,500

[22] Filed: Sep. 25, 1985

[51] Int. Cl.⁴ .................... H01L 29/78; H01L 27/02; H01L 29/06
[52] U.S. Cl. ..................... 357/42; 357/23.4; 357/23.6; 357/23.7; 357/41; 357/55
[58] Field of Search ............. 357/23.4, 23.6, 23.7, 357/41, 42, 55

[56] References Cited

U.S. PATENT DOCUMENTS

| | | | |
|---|---|---|---|
| 3,518,509 | 6/1970 | Cullis | 357/42 |
| 4,462,040 | 7/1984 | Ho et al. | 357/23.4 |
| 4,554,570 | 11/1985 | Jastrzebski et al. | 357/4 |
| 4,566,025 | 1/1986 | Jastrzebski et al. | 357/27.3 |

FOREIGN PATENT DOCUMENTS 60-02716  6/1985  Japan ........................ 357/42

Primary Examiner—Martin H. Edlow
Assistant Examiner—D. Featherstone
Attorney, Agent, or Firm—Rodney M. Anderson; Leo N. Heiting; Melvin Sharp

[57] ABSTRACT

One embodiment of the present invention includes a vertical inverter. A layer of P-type material is formed on the surface of an N+-type substrate, followed by formation of an N+ layer, a P+ layer, an N− layer, and a P+ layer. (Of course different doping configurations may be used and remain within the scope of the invention). A trench is then etched along one side of the stack thus formed and a connector is formed to the middle P+ and N+ layers. Another trench is then formed where a gate insulator and a- gate are formed. The gate serves as the gate for both the N-channel and P-channel transistors thus formed.

10 Claims, 3 Drawing Sheets

VERTICAL INVERTER

FIELD OF THE INVENTION

The present invention relates to the field of integrated circuit fabrication techniques. More specifically, the present invention relates to complementary metaloxide semiconductor (CMOS) design.

BACKGROUND OF THE INVENTION

The present integrated circuit fabrication techniques, where components are fabricated in the semiconductor substrate horizontally along the surface of the semiconductor substrate, are approaching insurmountable limitations in reducing the size of devices so formed. Lithographic techniques are being limited by fringing effects of even ultraviolet light and closely spaced horizontal field effect transistors are proving more and more prone to latchup. Consequently it is an object of the present invention to provide a technique which circumvents these problems.

SUMMARY

One embodiment of the present invention includes a vertical inverter. A layer of P-type material is formed on the surface of an N+-type substrate, followed by formation of an N+layer, a P+layer, an N−layer, and a P+layer. (Of course different doping configurations may be used and remain within the scope of the invention.) A trench is then etched along one side of the stack thus formed and a connector is formed to the middle P+ and N+layers. Another trench is then formed where a gate insulator and a gate are formed. The gate serves as the gate for both the N-channel and P-channel transistors thus formed.

DETAILED DESCRIPTION

Figure 1:
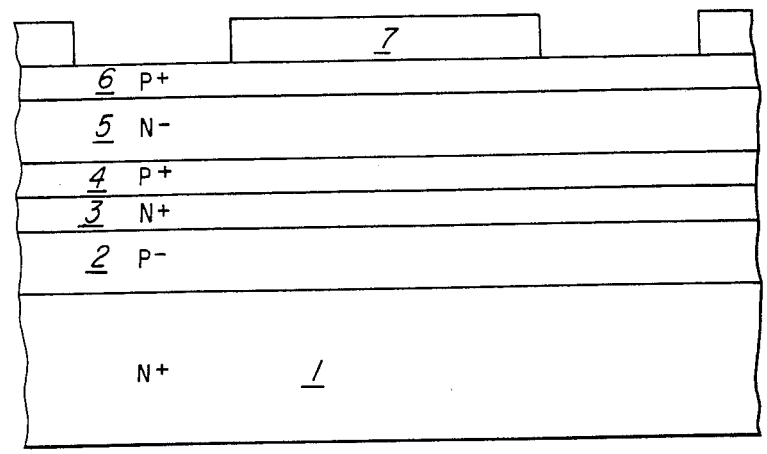
FIGS. 1 through 7 are side view schematic diagrams depicting the processing steps necessary to fabricate one embodiment of the present invention.
Figure 2:
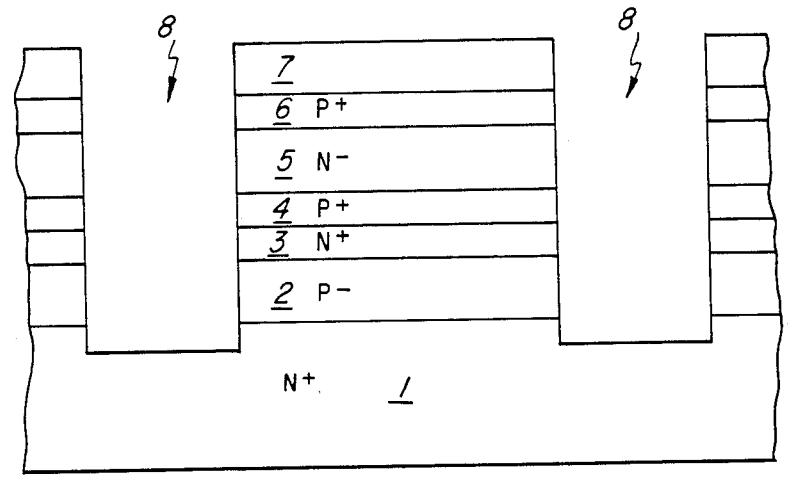

FIG. 1 is a side view schematic diagram depicting the initial processing steps for fabricating one embodiment of the present invention. Epitaxial layers 2 through 6 are fabricated on the surface of substrate 1 using, for example, molecular beam epitaxial techniques. Using these techniques very abrupt transitions between N and P type doping material may be fabricated. For example, using present techniques, P−type layer 2 may be approximately 2000 to 5000 angstroms thick. N+layer 3 may be 1000 to 2000 angstroms thick. P+layer 4 may be 1000 to 2000 angstroms thick. N−layer 5 may be 2000 to 5000 angstroms thick and P+layer 6 is approximately 1000 to 2000 angstroms thick. Of course, thinner or thicker layers are considered within the scope of the invention. Masking layer 7 is formed of a suitable masking material and patterned using commonly known photolithographic techniques on the surface of P+layer 6. Masking layer 7 is used during an etching process to fabricate trenches 8 as shown in FIG. 2.

Figure 3:
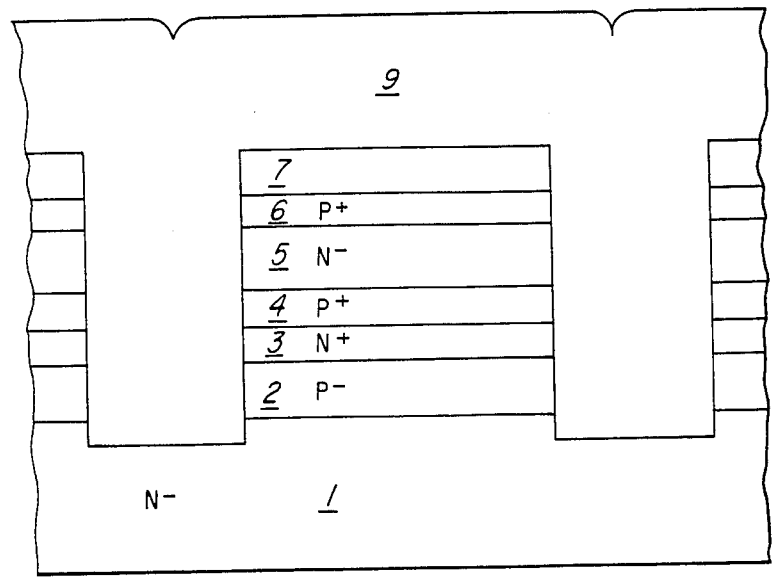
Figure 4:
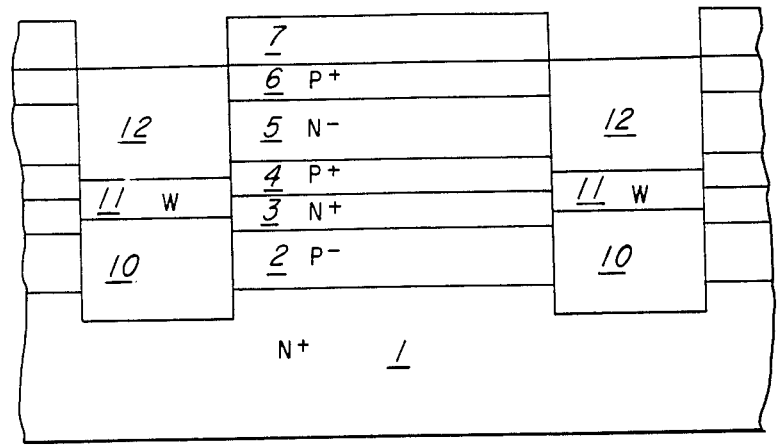

Trenches 8 are fabricated with two objects in mind. The primary object is fabrication of an interconnection layer between vertical inverters as they are subsequently described in this detailed description. A secondary object is to provide isolation between vertical inverters fabricated as described in this detailed description. The isolation regions will be masked so as to provide an area in trenches 8 which is entirely filled with silicon dioxide. Silicon dioxide layer 9 is formed on the surface of the structure of FIG. 2 as shown in FIG. 3 using, for example, chemical vapor deposition. Silicon dioxide layer 9 is etched back to provide silicon dioxide regions which fill trenches 8 in regions where specific vertical inverters are to be electrically isolated from one another (not shown). In other areas of the integrated circuit silicon dioxide layer 9 is etched back to provide silicon dioxide plugs 10 as shown in FIG. 4. Similar filling and etch back techniques are used to fabricate tungsten layers 11 and silicon dioxide layers 12. Layer 11 is tungsten as an example, other conductive materials may be substituted for tungsten in layer 11. Masking layer 7 is then removed and masking layer 13 is formed on the surface of the structure of FIG. 4.

Figure 5:
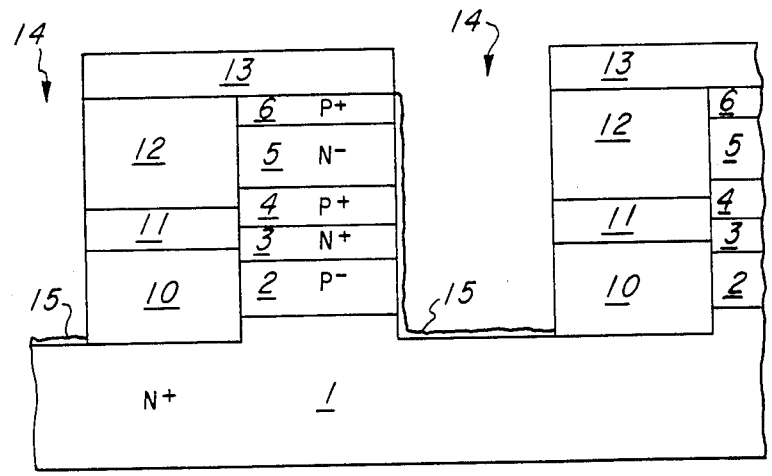
Figure 6:
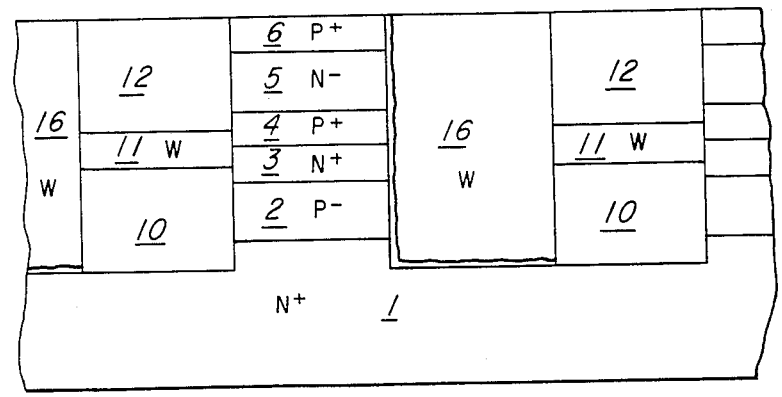

Masking layer 13 is used to mask the etching processes used to fabricate trenches 14 as shown in FIG. 5. The structure of FIG. 5 is then subjected to a thermal oxidation process to provide silicon dioxide layers 15 as shown in FIG. 5. Care must be used in this step in order to provide adequate gate insulation for the vertical inverter but not cause excessive diffusion of the dopants in layers 2 through 6 and thereby destroy the definition of the vertical transistors. Tungsten gates 16 are then formed in trenches 14 using a fill and etch back technique as earlier described with regard to layer 9. Appropriate interconnections are then fabricated on the surface of the structure of FIG. 6 as shown in FIG. 7.

Figure 7:
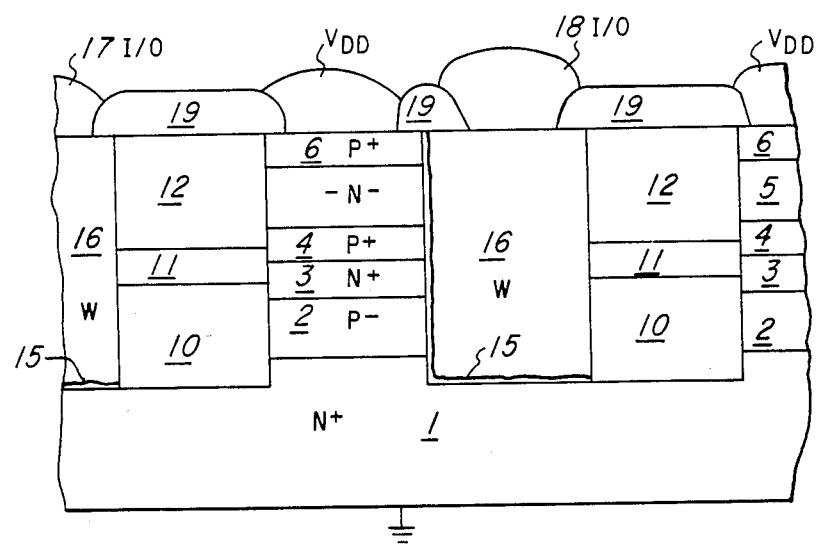

Tungsten gates 16 serve as input and output connections 17 and 18 as shown in FIG. 7. Positive voltage is applied to P+layers 6 and ground voltages applied to substrate 1 thus providing a vertical complementary metal oxide semiconductor inverter. The P channel transistor is formed by P+layer 6 which serves as a source, P+layer 4 which serves as a drain and N−layer 5 which provides a channel region. The gate of the P channel transistor is formed by tungsten gate 16. The N channel transistor is formed by N+layer 3 which serves as a drain, N+substrate 1 which serves as a source and P−layer 2 which provides a channel region, the gate of the N channel transistor is formed by tungsten gate 16.

The horizontal limitations on the size of tungsten gate 16, the transistor stacks provided by layers 2 through 6 and interconnection region 11 is limited by the photolithographic techniques used to fabricate this embodiment of the present invention. Using present techniques the entire vertical inverter would occupy approximately 3 microns wide as shown horizontally in FIG. 7 and would be approximately 1 micron thick using the thickness perpendicular to the plane of the page plus another micron thick for the isolation regions which were not shown. Thus an entire CMOS inverter is provided in an area of approximately 6 square microns. In addition, the inverter is nearly impervious to latch-up problems because the inverter is comprised of a 5 layer stack between positive voltage supply and ground with no intervening junction between an N-tank and a P-tank.

Although specific embodiments of the present invention are herein described, this is not to be construed as limiting the scope of the present invention. Other embodiments of the present invention will become obvious to those skilled in the art in light of the teachings of the present invention. This invention is only limited by the claims appended hereto.

TECHNICAL ADVANTAGES

The present invention provides an extremely small vertical inverter occupying a minimum of surface area of an integrated circuit. In addition, the present invention provides a vertical inverter which is nearly impervious to latchup problems experienced by techniques now known in the art.

I claim:
1. An integrated electronic device, comprising:
   a substrate of a first conductivity type;
   a first channel layer of a second conductivity type formed on the surface of said substrate;
   a first drain layer of said first conductivity type formed on the surface of said first channel layer;
   a second drain layer of said second conductivity type formed on the surface of said first drain layer;
   a second channel layer of said first conductivity type formed on the surface of said second drain layer;
   a source layer of said second conductivity type formed on the surface of said second channel layer;
   a conductive gate vertically disposed on an edge perpendicular to the plane of and adjacent to said first and second channel layers, said first and second drain layers and said source layer wherein said gate is insulated from said layers; and
   a conductive region connected to said first and second drain layer.

2. A device as in claim 1 wherein said first conductivity type is P and said second conductivity type is N.

3. A device as in claim 1 wherein a supply voltage is applied to said source layer and a reference voltage is applied to said substrate.

4. A device as in claim 3 wherein an input signal is applied to said gate and an output signal is provided on said conductive region.

5. A plurality of integrated electronic devices formed in a substrate of a first conductivity type, each device comprising:
   a first channel layer of a second conductivity type formed on the surface of said substrate;
   a first drain layer of said first conductivity type formed on the surface of said first channel layer;
   a second drain layer of said second conductivity type formed on the surface of said first drain layer;
   a second channel layer of said first conductivity type formed on the surface of said second drain layer;
   a source layer of said second conductivity type formed on the surface of said second channel layer;
   a conductive gate vertically disposed on an edge perpendicular to the plane of and adjacent to said first and second channel layers, said first and second drain layers and said source layer wherein said gate is insulated from said layers; and
   a conductive region connected to said first and second drain layer wherein said conductive region is connected to the conductive gate of an adjacent cell in selected cells.

6. A plurality of devices as in claim 5 wherein said first conductivity type is P and said second conductivity type is N.

7. A plurality of devices as in claim 5 wherein a supply voltage is applied to said source layer and a reference voltage is applied to said substrate.

8. A device as in claim 7 wherein an input signal is applied to said gate and an output signal is provided on said conductive region.

9. An integrated electronic device, comprising:
   a crystalline silicon substrate of a first conductivity type;
   a first channel layer of crystalline silicon and of a second conductivity type formed on the surface of said substrate;
   a first drain layer of crystalline silicon and of said first conductivity type formed on the surface of said first channel layer;
   a second drain layer of crystalline silicon and of said second conductivity type formed on the surface of said first drain layer;
   a second channel layer of crystalline silicon and of said first conductivity type formed on the surface of said second drain layer;
   a source layer of crystalline silicon and of said second conductivity type formed on the surface of said second channel layer;
   a tungsten gate vertically disposed on an edge perpendicular to the plane of and adjacent to said first and second channel layers, said first and second drain layers and said source layer wherein said gate is insulated from said layers; and
   a tungsten region connected to said first and second drain layer.

10. A device as in claim 9 wherein said first conductivity type is P and said second conductivity type is N.

* * * * *